United States Patent [19]
Stamper

[11] Patent Number: 5,851,903
[45] Date of Patent: Dec. 22, 1998

[54] METHOD OF FORMING CLOSELY PITCHED POLYSILICON FUSES

[75] Inventor: Anthony K. Stamper, Williston, Vt.

[73] Assignee: International Business Machine Corporation, Armonk, N.Y.

[21] Appl. No.: 805,023

[22] Filed: Feb. 21, 1997

Related U.S. Application Data

[63] Continuation of Ser. No. 699,830, Aug. 20, 1996, abandoned.

[51] Int. Cl.⁶ .......................... H01L 21/326; H01L 21/479
[52] U.S. Cl. .......................... 438/467; 438/132; 438/601; 438/460
[58] Field of Search .................................. 438/132, 281, 438/460, 462, 467, 601

[56] References Cited

U.S. PATENT DOCUMENTS

| | | | |
|---|---|---|---|
| 4,413,272 | 11/1983 | Mochizuki et al. | 257/529 |
| 4,792,835 | 12/1988 | Sacarisen et al. | 357/23.6 |
| 5,235,205 | 8/1993 | Lippitt, III | 257/529 |
| 5,241,212 | 8/1993 | Motonami et al. | 257/529 |
| 5,252,844 | 10/1993 | Takagi | 257/529 |
| 5,365,104 | 11/1994 | Godinho et al. | 257/529 |
| 5,420,455 | 5/1995 | Gilmour | 257/529 |
| 5,444,012 | 8/1995 | Yoshizumi et al. | 437/60 |
| 5,451,810 | 9/1995 | Tigelaar et al. | 257/529 |
| 5,550,399 | 8/1996 | Okazaki | 257/529 |
| 5,550,404 | 8/1996 | Yen et al. | 257/530 |
| 5,585,662 | 12/1996 | Ogawa | 257/529 |
| 5,614,440 | 3/1997 | Bezama et al. | 437/195 |
| 5,641,703 | 6/1997 | Cohen et al. | 438/467 |

FOREIGN PATENT DOCUMENTS 6-232362  8/1994  Japan .

*Primary Examiner*—Joni Chang
*Attorney, Agent, or Firm*—Whitham, Curtis & Whitham; William D. Sabo, Esq.

[57] ABSTRACT

A method for decreasing the pitch of polysilicon fuses uses tungsten barriers formed adjacent to the fuse elements. The tungsten barriers are made compatible with the process to form a crack stop by stacking tugsten at the via level on top of the tungsten at the contact level in the crack stop. An interlevel dielectric is used as a cover for the fuse.

4 Claims, 5 Drawing Sheets

METHOD OF FORMING CLOSELY PITCHED POLYSILICON FUSES

CROSS REFERENCE TO RELATED APPLICATION

This application is a continuation of application Ser. No. 08/699,830 filed Aug. 20, 1996, abandoned.

BACKGROUND OF THE INVENTION

1. Field of the invention

The present invention generally relates to the manufacture of polysilicon fuses in semiconductor devices and, more particularly, to a method of forming closely pitched polysilicon fuses which allows the density of fuses to be increased without the risk of damaging adjacent fuses when a fuse is blown.

2. Background Description

Crack stops are employed in silicon chip processing to reduce damage caused by chip dicing. A crack stop is typically a narrow trench etched down to the silicon substrate around the chip. A common method of forming the crack stop is to form a tungsten-filled trench around the chip, expose the tungsten trench, and wet etch out the tungsten using hydrogen peroxide.

Fuse arrays are commonly formed in very-large scale integrated (VLSI) circuits. The purpose of the fuses may be variously to customize the semiconductor device for a specific application or to disconnect a defective part of the device leaving a redundant part connected. The preferred manner of blowing a fuse is by laser ablation, but this creates a pit which limits how closely spaced fuses can be in the array to avoid damaging adjacent fuses.

It is known to use tungsten fuse barriers in aluminum/copper (AlCu) alloy fuses in order to protect adjacent fuses; however, tungsten fuse barriers are not compatible with the standard polysilicon fuse/crack stop process. This is because, in standard processing, the terminal via reactive ion etching (RIE) which thins the insulator above the polysilicon fuse also exposes the tungsten crack stop. If a tungsten fuse barrier were present, it would be removed when the tungsten crack stop was removed with the hydrogen peroxide etch.

SUMMARY OF THE INVENTION

It is therefore an object of the present invention to provide a method of forming closely pitched polysilicon fuses using tungsten fuse barriers in order to permit closely pitched polysilicon fuses.

According to the invention, there is provided a method for decreasing the pitch of polysilicon fuses in which tungsten barriers are formed adjacent to the fuse elements and then making the tungsten barriers compatible with a process to form a crack stop. In the preferred embodiment, the tungsten is stacked at the via level on top of the tungsten at the contact level in the crack stop and an interlevel dielectric is used as a cover for the fuse. In this way, the tungsten fuse barrier process is made compatible with the polysilicon fuse/crack stop process.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
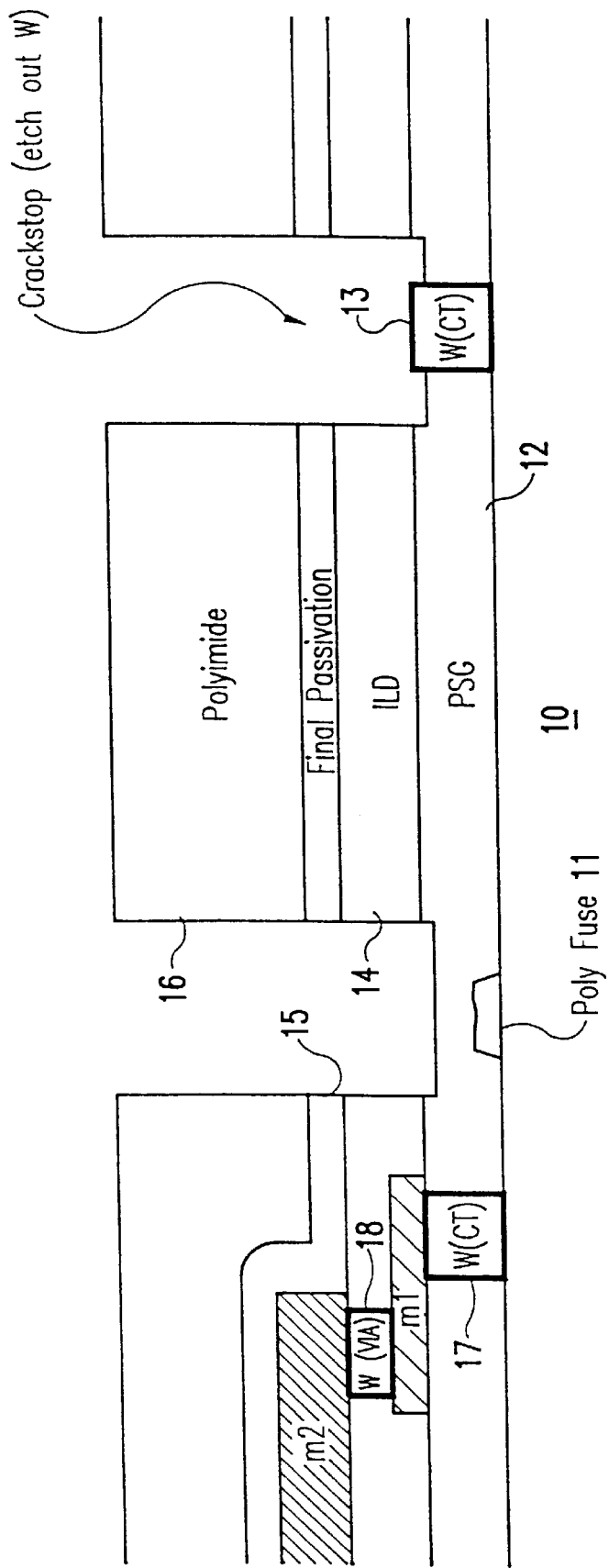
FIG. 1 is a cross-sectional view of a known tungsten barrier crack stop and polysilicon fuse structure.

Referring now to the drawings, and more particularly to FIG. 1, the process for forming a conventional crack stop and polysilicon fuse will first be described to illustrate the novel features of the invention. In FIG. 1, there is shown in cross-section a conventional crack stop formed in semiconductor device. This crack stop is formed around the periphery of the device. FIG. 1 also shows in cross-section a conventional polysilicon fuse formed elsewhere in the semiconductor device. The fuse may be constituted as the gate structure of a metal oxide semiconductor (MOS) device formed in an array of such devices.

Figure 2:
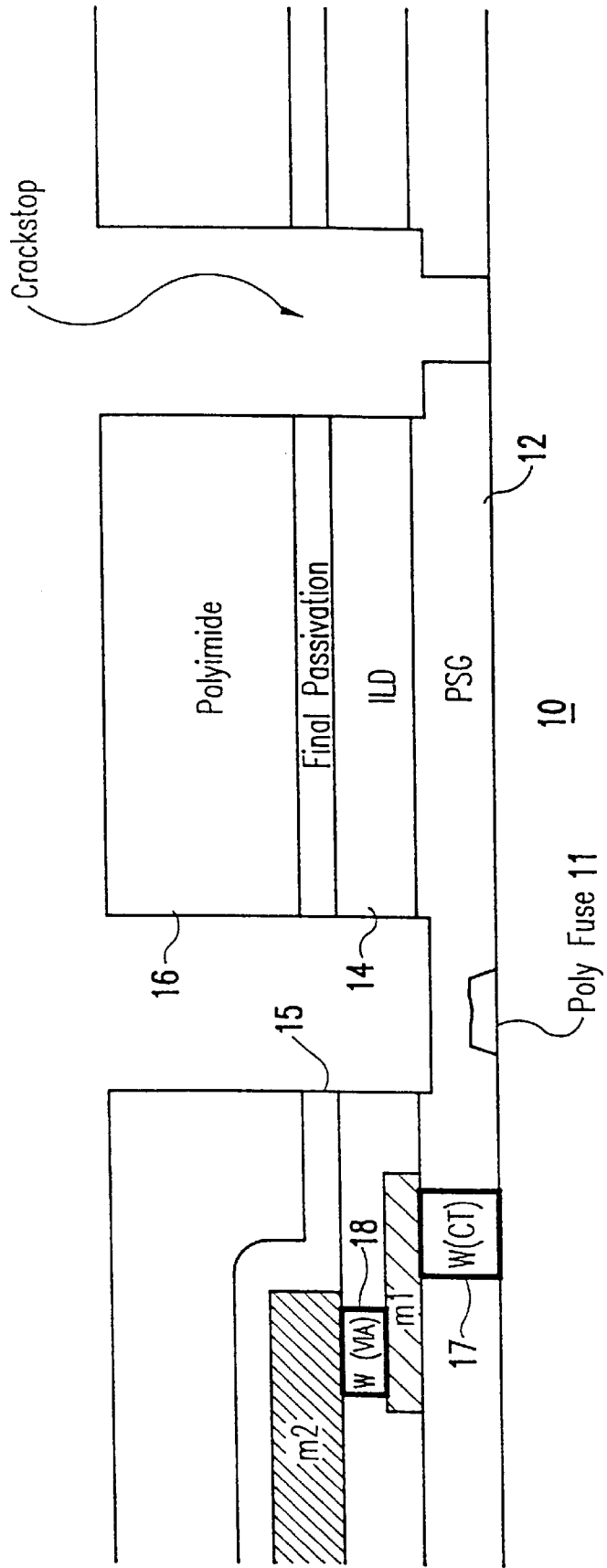
FIG. 2 is a cross-sectional view showing the structure of FIG. 1 after a hydrogen peroxide etch to remove the tungsten in the crack stop trench.

The crack stop and the fuse shown in FIG. 1 are formed as part of the process of manufacturing the semiconductor device. Beginning with a substrate 10, the polysilicon fuse 11 is first patterned on the substrate. Then a layer 12 of phosphorous silicate glass (PSG) is deposited. PSG is a phosphorous doped silicon dioxide ($SiO_2$). The PSG layer 12 is then etched in a ring shape near the periphery of the semiconductor device, and a tungsten (W) fill 13 is deposited at the contact level (CT) to form the crack stop in the etched ring shaped area. At the same time, tungsten contacts 17 are formed in etched areas of the PSG 12. A first metalization layer (M1), constituting a first wiring layer in electrical contact with the tungsten contacts 17, is typically formed on the PSG layer 12. Next, an interlayer dielectric (ILD) layer 14 is deposited. A damascene wiring level may be formed in the ILD layer 14 or a second metalization layer (M2) constituting a second wiring level may be formed on top of the ILD layer 14. The choice depends on the specific semiconductor device and process used. In the example illustrated, the ILD layer 14 is etched in selected areas to the first metalization layer (M1) and tungsten deposited to form tungsten vias 18. A second metalization layer (M2) in electrical contact with the vias 18 is then formed on the ILD layer 14. A final passivation layer 15 is next deposited. This layer may be, for example, silicon dioxide ($SiO_2$) or silicon nitride ($Si_3N_4$). A polyimide layer 16 is then deposited over the final passivation layer 15. The device is then patterned and etched to expose the tungsten fill 13 at the contact level. A thin oxide remains over the polysilicon fuse 11 as shown in FIG. 1. This thin oxide serves as an encapsulation of the fuse which is part of the device wiring unless blown. In the final processing step, the device is dip etched in hydrogen peroxide ($H_2O_2$) to etch the tungsten in the crack stop trench, resulting in the structure shown in FIG. 2. If a tungsten barrier between the polysilicon fuses 11 were included, it would be exposed with the tungsten 13 of the crack stop and removed along with the crack stop tungsten during the hydrogen peroxide etch.

Figure 3:
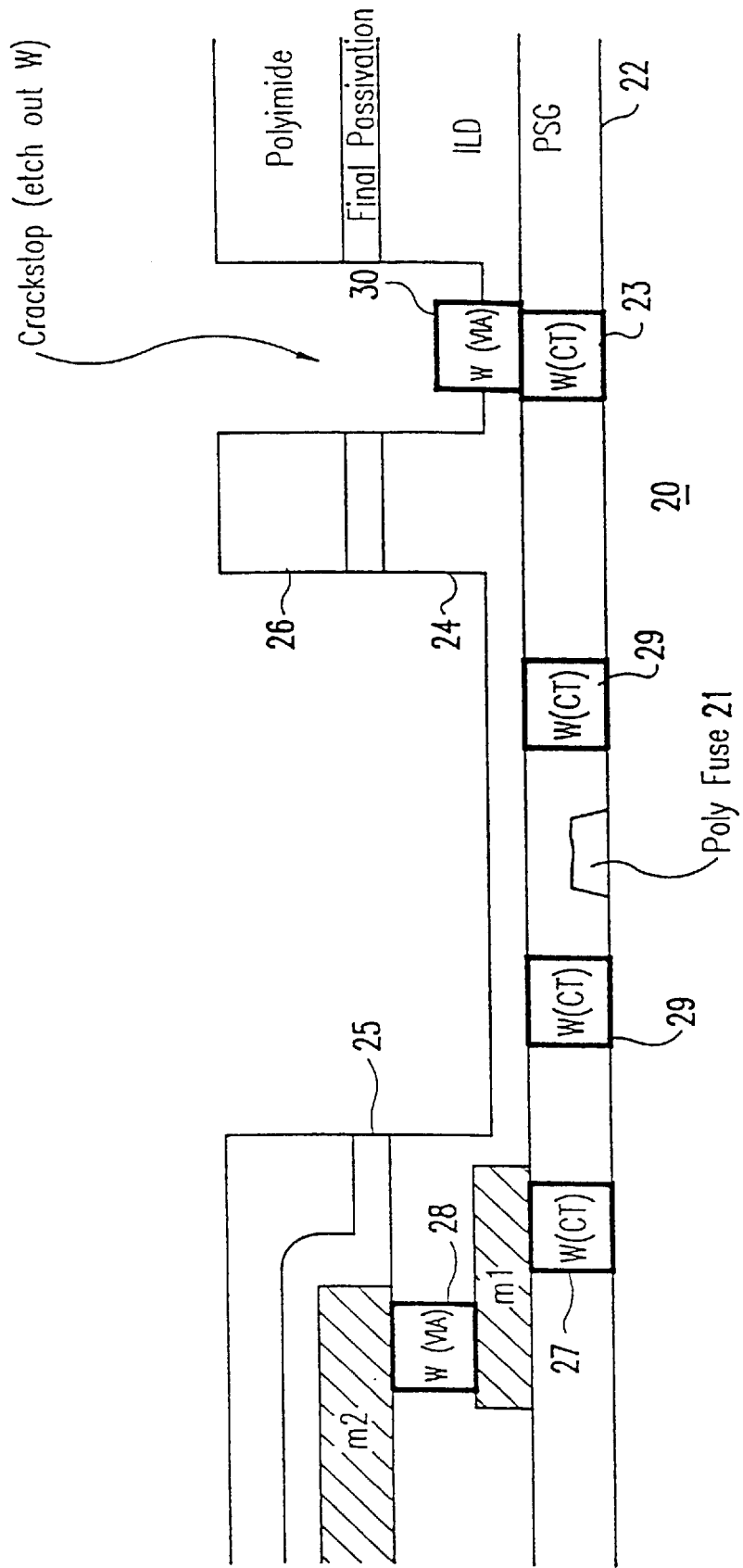
FIG. 3 is a cross-sectional view of stacked tungsten barrier crack stop and a polysilicon fuse using tungsten barriers according to the invention.
Figure 4:
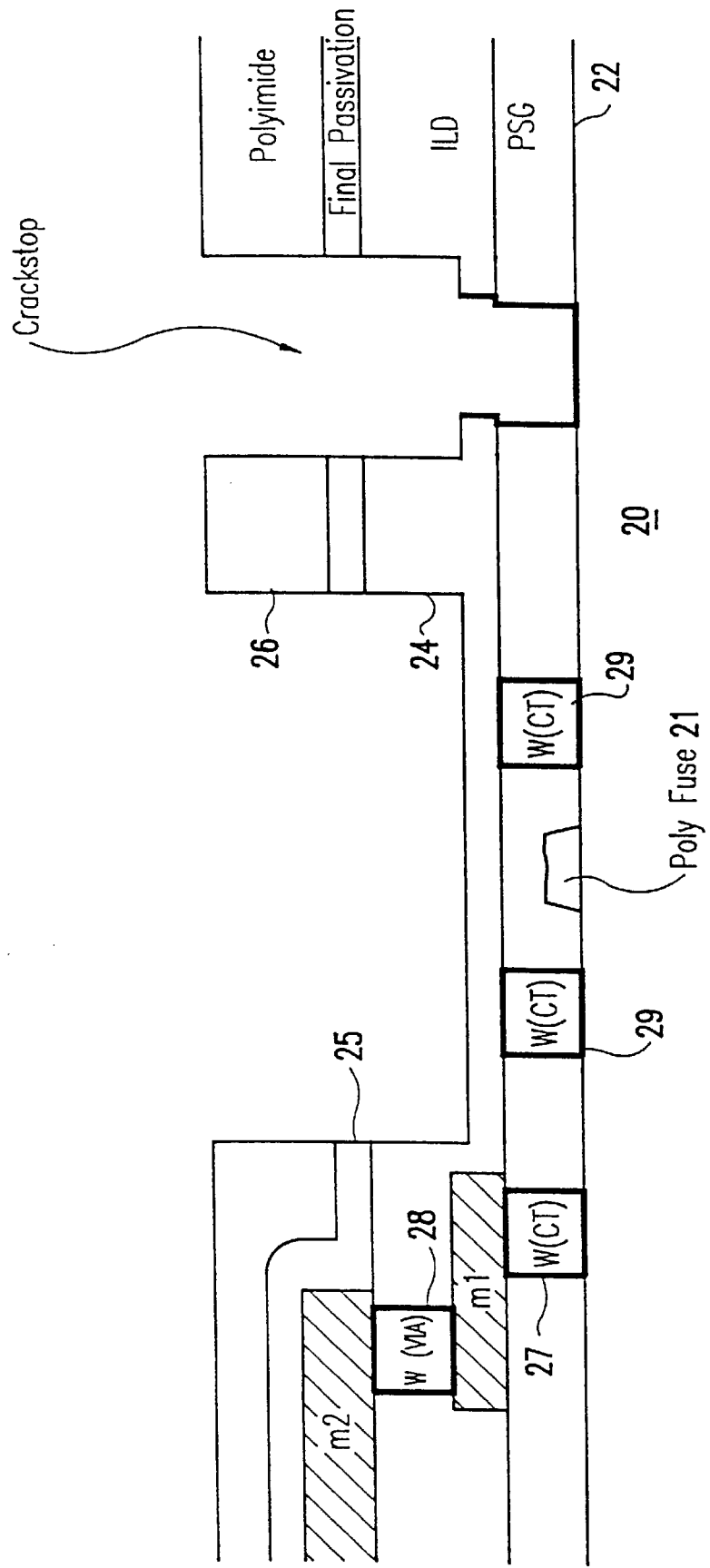
FIG. 4 is a cross-sectional view showing the structure of FIG. 3 after a hydrogen peroxide etch to remove the tungsten in the crack stop trench.

FIG. 3 shows in cross-section the crack stop and the polysilicon fuse with tungsten barriers according to the invention. Beginning with a substrate 20, the polysilicon fuse 21 is first patterned on the substrate, and then a layer 22 of phosphorous silicate glass (PSG) is deposited as before. The PSG is then etched in barrier areas on either side of the polysilicon fuses 21 and in a first ring shaped area near the periphery of the semiconductor device. A first tungsten (W) fill is then deposited at the contact level (CT) to form the tungsten barrier areas 29 and the crack stop 23. A first metalization layer (M1) is formed on the PSG layer 22. Next, an interlayer dielectric (ILD) layer 24 is deposited. The ILD layer is then etched to expose the first tungsten fill 23 of the crack stop, forming a second ring at the via level. This second ring is then filled with a second tungsten fill 30 deposited on top of the first tungsten fill 23. Note that in the crack stop, the tungsten fill 23 at the contact level and the tungsten fill 30 at the via level are stacked. Again, a damascene wiring level may be formed in the ILD layer 24 or, as shown in FIG. 3, a second metalization layer (M2) constituting this wiring level may be formed on top of the ILD layer 24. A final passivation layer 25 is next deposited. As before, this layer may be, for example, silicon dioxide ($SiO_2$) or silicon nitride ($Si_3N_4$). A polyimide layer 26 is then deposited over the final passivation layer 25. The device is then patterned and etched to expose the tungsten fill 30 at the via level. A thin oxide and a thin ILD remains over the polysilicon fuse 21 as shown in FIG. 3. In the final processing step, the device is dip etched in hydrogen peroxide ($H_2O_2$) to etch the stacked tungsten via and contact levels of the crack stop, as shown in FIG. 4. A brief etch would also be required, followed by another hydrogen peroxide etch, if a tungsten-via liner was employed. Tungsten-via liners are used to reduce tungsten-via resistance.

Figure 5:
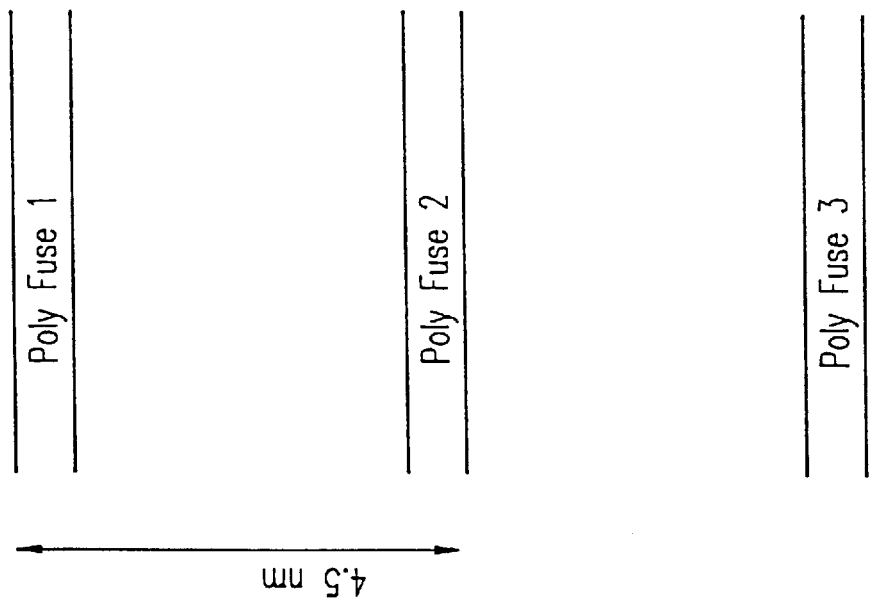
FIG. 5 is a plan view showing the relative spacing of polysilicon fuses using conventional techniques without tungsten barriers.
Figure 6:
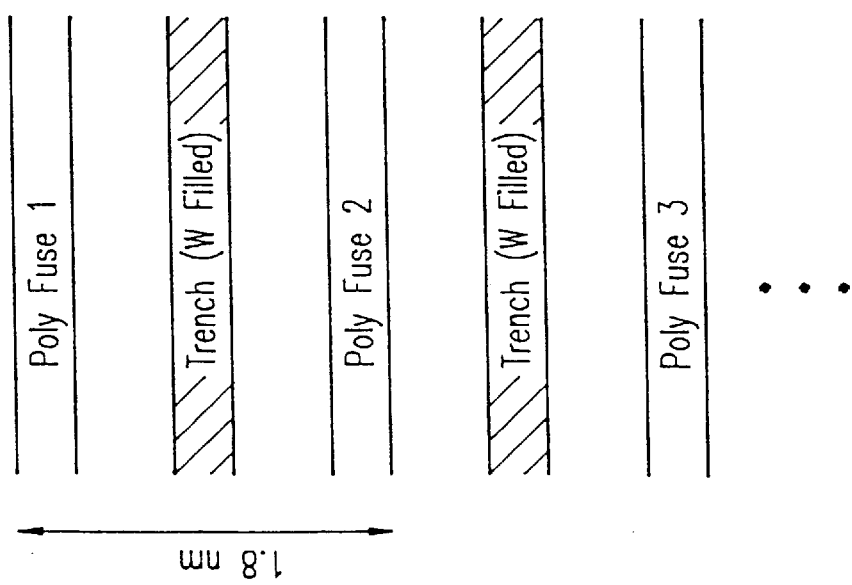
FIG. 6 is a plan view showing the relative spacing of the polysilicon fuses with tungsten barriers according to the invention.

FIGS. 5 and 6 show the relative improvement in fuse pitch afforded by the invention. FIG. 5 shows a partial array of polysilicon fuses with a spacing of 4.5 $\mu$m, which is currently a closely spaced as the fuses can be made without a high risk of damaging adjacent fuses with a fuse is blown by laser ablation. FIG. 6 shows a partial array of polysilicon fuses with alternating tungsten barriers. With the addition of the tungsten barriers, the spacing has been reduced to 1.8 $\mu$m in a specific implementation.

Thus, the invention allows the use of tungsten fuse barriers in a process that is compatible with polysilicon fuse manufacture. This, in turn, permits forming closely pitched polysilicon fuses so that higher density fuse arrays can be achieved without the possibility of damaging adjacent fuses when a fuse is blown.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of forming a semiconductor device comprising the steps of:

forming a polysilicon fuse on a top surface of a substrate in an area having a periphery;

depositing a first dielectric material on top of both the fuse and the substrate;

removing the first dielectric material in barrier areas positioned on either side of the fuse and in a first ring shaped area near said periphery;

filling both the barrier areas and the first ring shaped area with a first tungsten fill;

depositing a second dielectric material on top of the first dielectric material and the first tungsten fill;

removing the second dielectric material from above the first ring shaped area to expose the first tungsten fill, thereby forming a second ring;

filling the second ring with a second tungsten fill;

depositing a final passivation layer on top of the second dielectric material and the second tungsten fill;

depositing a polyimide layer on top of the final passivation layer;

removing the polyimide, final passivation layer, and a portion of the second dielectric material over the polysilicon fuse and the second ring; and etching the second tungsten fill and the first tungsten fill in said first ring shaped area to form a crack stop.

2. The method of forming a semiconductor device as in claim 1 wherein said first dielectric material is a doped silicon dioxide and said second dielectric material is selected from group consisting of silicon dioxide and silicon nitride, said second dielectric material protecting the first tungsten fill in the barrier areas during said etching step.

3. A method for producing closely pitched polysilicon fuses in a semiconductor device comprising the steps of:

forming an array of closely pitched polysilicon fuses on a top surface of a semiconductor substrate on which a semiconductor device is formed having a periphery;

depositing a phosphorous silicate glass layer on top of both the fuses and the top surface of the substrate;

removing the phosphorous silicate glass layer in barrier areas positioned intermediate fuses in the array of polysilicon fuses and in a first ring shaped area near the periphery of the semiconductor device;

filling both the barrier areas and the first ring shaped area with a first tungsten fill;

depositing an interlevel dielectric layer on top of the phosphorous silicate glass layer and the first tungsten fill;

removing the interlevel dielectric layer from above the first ring shaped area to expose the first tungsten fill, thereby forming a second ring;

filling the second ring with a second tungsten fill;

depositing a final passivation layer on top of the interlevel dielectric layer and the second tungsten fill;

depositing a polyimide layer on top of the final passivation layer;

removing the polyimide and final passivation layers over the barrier areas and the second ring; and removing the second tungsten fill and the first tungsten fill in the first ring shaped area, said interlevel dielectric layer protecting the first tungsten fill in the barrier areas during said removing step.

4. The method of forming a semiconductor device as in claim 3 wherein the phosphorous silicate glass layer is a doped silicon dioxide and said interlevel dielectric layer is selected from group consisting of silicon dioxide and silicon nitride.

* * * * *